(12) United States Patent
Ben-Moshe et al.

(10) Patent No.: US 10,705,907 B1
(45) Date of Patent: Jul. 7, 2020

(54) DATA PROTECTION IN A HETEROGENEOUS RANDOM ACCESS STORAGE ARRAY

(71) Applicant: EMC Corporation, Hopkinton, MA (US)

(72) Inventors: Tal Ben-Moshe, Kiryat Ono (IL); Anton Kucherov, Milford, MA (US); Niko Farhi, Petah-Tivka (IL); Kirill Shoikhet, Raanana (IL); David Krakov, Ramat Gan (IL); Eli Dorfman, Raanana (IL)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 44 days.

(21) Appl. No.: 15/079,208

(22) Filed: Mar. 24, 2016

(51) Int. Cl.
*G06F 11/10* (2006.01)
*G11C 29/52* (2006.01)
*G06F 3/06* (2006.01)

(52) U.S. Cl.
CPC .......... *G06F 11/1068* (2013.01); *G06F 3/064* (2013.01); *G06F 3/0619* (2013.01); *G06F 3/0688* (2013.01); *G11C 29/52* (2013.01)

(58) Field of Classification Search
CPC ............. G06F 11/1076; G06F 11/1008; G06F 11/1004; G06F 11/1068; G06F 3/0688; G06F 3/064; G06F 3/0619; G11B 20/1833; G11C 29/52; H05K 999/99
USPC ....................................................... 714/766
See application file for complete search history.

(56) References Cited

U.S. PATENT DOCUMENTS

| | | | |
|---|---|---|---|
| 5,204,958 A | 4/1993 | Cheng et al. | |
| 5,453,998 A | 9/1995 | Dang | |
| 5,603,001 A | 2/1997 | Sukegawa et al. | |
| 6,085,198 A | 7/2000 | Skinner et al. | |
| 6,125,399 A | 9/2000 | Hamilton | |
| 6,671,694 B2 | 12/2003 | Baskins et al. | |
| 7,073,115 B2 | 7/2006 | English et al. | |
| 7,203,796 B1 | 4/2007 | Muppalaneni et al. | |
| 7,472,249 B2 | 12/2008 | Cholleti et al. | |
| 7,908,484 B2 | 3/2011 | Haukka et al. | |
| 8,341,479 B2 * | 12/2012 | Bichot .................. | H04L 1/1867 714/4.1 |
| 8,386,425 B1 | 2/2013 | Kadayam et al. | |
| 8,386,433 B1 | 2/2013 | Kadayam | |

(Continued)

FOREIGN PATENT DOCUMENTS

JP   2014-206884   10/2014

OTHER PUBLICATIONS

Response to U.S. Office Action dated Jun. 10, 2016 corresponding to U.S. Appl. No. 14/228,971; Response filed Aug. 17, 2016; 10 Pages.

(Continued)

*Primary Examiner* — Albert Decady
*Assistant Examiner* — Enam Ahmed
(74) *Attorney, Agent, or Firm* — Daly, Crowley Mofford & Durkee, LLP

(57) ABSTRACT

Described herein are embodiments of a process for efficiently allocating RAID stripes across an array of disks (e.g., SSDs). In some embodiments, the process can be used to allocate RAID stripes across a "heterogeneous" storage array (i.e., an array of different sized disks). Also described herein are embodiments of a storage system that utilize said processing.

14 Claims, 4 Drawing Sheets

(56) References Cited

U.S. PATENT DOCUMENTS

| | | | |
|---|---|---|---|
| 8,484,536 B1* | 7/2013 | Cypher | G06F 11/1076 |
| | | | 711/148 |
| 8,566,673 B2* | 10/2013 | Kidney | G06F 11/1092 |
| | | | 714/766 |
| 8,694,849 B1* | 4/2014 | Micheloni | G06F 11/1048 |
| | | | 714/753 |
| 8,706,932 B1* | 4/2014 | Kanapathippillai | |
| | | | G06F 13/1694 |
| | | | 710/62 |
| 8,799,705 B2 | 8/2014 | Hallak et al. | |
| 9,026,729 B1 | 5/2015 | Hallak et al. | |
| 9,063,910 B1 | 6/2015 | Hallak et al. | |
| 9,104,326 B2 | 8/2015 | Frank et al. | |
| 9,606,734 B2* | 3/2017 | Ioannou | G06F 3/0608 |
| 9,606,870 B1* | 3/2017 | Meiri | G06F 11/1092 |
| 9,703,789 B2 | 7/2017 | Bowman et al. | |
| 9,841,908 B1* | 12/2017 | Zhao | G06F 3/0611 |
| 2002/0002642 A1* | 1/2002 | Tyson | G11B 20/1833 |
| | | | 710/65 |
| 2003/0061227 A1 | 3/2003 | Baskins et al. | |
| 2003/0196023 A1* | 10/2003 | Dickson | G06F 11/1076 |
| | | | 711/1 |
| 2004/0267835 A1 | 12/2004 | Zwilling et al. | |
| 2006/0085674 A1* | 4/2006 | Ananthamurthy | G11B 20/10 |
| | | | 714/6.12 |
| 2006/0271540 A1 | 11/2006 | Williams | |
| 2007/0089045 A1 | 4/2007 | Corbett et al. | |
| 2007/0240125 A1 | 10/2007 | Degenhardt et al. | |
| 2007/0283086 A1* | 12/2007 | Bates | G06F 3/0613 |
| | | | 711/113 |
| 2008/0082969 A1 | 4/2008 | Agha et al. | |
| 2008/0235793 A1 | 9/2008 | Schunter et al. | |
| 2009/0172464 A1* | 7/2009 | Byrne | G06F 11/1088 |
| | | | 714/5.11 |
| 2009/0216953 A1 | 8/2009 | Rossi | |
| 2010/0005233 A1 | 1/2010 | Hosokawa | |
| 2010/0250611 A1 | 9/2010 | Krishnamurthy | |
| 2011/0087854 A1 | 4/2011 | Rushworth et al. | |
| 2011/0137916 A1 | 6/2011 | Deen et al. | |
| 2011/0302587 A1 | 12/2011 | Nishikawa et al. | |
| 2012/0023384 A1 | 1/2012 | Naradasi et al. | |
| 2012/0124282 A1 | 5/2012 | Frank et al. | |
| 2012/0158736 A1 | 6/2012 | Milby | |
| 2012/0204077 A1 | 8/2012 | D'Abreu et al. | |
| 2012/0233432 A1 | 9/2012 | Feldman et al. | |
| 2013/0036289 A1 | 2/2013 | Welnicki et al. | |
| 2013/0212074 A1 | 8/2013 | Romanski et al. | |
| 2013/0290285 A1 | 10/2013 | Gopal et al. | |
| 2013/0318053 A1 | 11/2013 | Provenzano et al. | |
| 2013/0326318 A1 | 12/2013 | Haswell | |
| 2013/0346716 A1 | 12/2013 | Resch | |
| 2014/0019764 A1 | 1/2014 | Gopal et al. | |
| 2014/0032992 A1 | 1/2014 | Hara et al. | |
| 2014/0122823 A1 | 5/2014 | Gupta et al. | |
| 2014/0188805 A1 | 7/2014 | Vijayan | |
| 2014/0189212 A1* | 7/2014 | Slaight | G06F 12/0866 |
| | | | 711/103 |
| 2014/0208024 A1* | 7/2014 | Simionescu | G06F 3/061 |
| | | | 711/114 |
| 2014/0244598 A1 | 8/2014 | Haustein et al. | |
| 2015/0019507 A1 | 1/2015 | Aronovich | |
| 2015/0098563 A1 | 4/2015 | Gulley et al. | |
| 2015/0149789 A1 | 5/2015 | Seo et al. | |
| 2015/0186215 A1 | 7/2015 | Das Sharma et al. | |
| 2015/0199244 A1* | 7/2015 | Venkatachalam | G06F 11/1666 |
| | | | 714/6.3 |
| 2015/0205663 A1* | 7/2015 | Sundaram | G06F 11/108 |
| | | | 714/6.24 |
| 2015/0269023 A1* | 9/2015 | Taranta, II | G06F 11/1076 |
| | | | 714/766 |
| 2016/0011941 A1* | 1/2016 | He | G06F 11/1076 |
| | | | 714/766 |
| 2016/0110252 A1 | 4/2016 | Hyun et al. | |
| 2016/0132270 A1 | 5/2016 | Miki | |
| 2016/0188487 A1* | 6/2016 | Fekete | G06F 12/1009 |
| | | | 711/114 |
| 2017/0123995 A1* | 5/2017 | Freyensee | G06F 12/10 |
| 2017/0255515 A1 | 9/2017 | Kim et al. | |
| 2017/0262191 A1* | 9/2017 | Dewakar | G06F 3/0611 |

OTHER PUBLICATIONS

U.S. Final Office Action dated Oct. 4, 2016 corresponding to U.S. Appl. No. 14/228,971; 37 Pages.
U.S. Appl. No. 15/282,546, filed Sep. 30, 2016, Kucherov et al.
U.S. Appl. No. 15/281,593, filed Sep. 30, 2016, Braunschvig et al.
U.S. Appl. No. 15/281,597, filed Sep. 30, 2016, Bigman.
Request for Continued Examination (RCE) and Response to U.S. Final Office Action dated Oct. 4, 2016 corresponding to U.S. Appl. No. 14/228,971; RCE and Response filed on Jan. 4, 2017; 19 Pages.
U.S. Appl. No. 14/228,971, filed Mar. 28, 2014, Shoikhet et al.
U.S. Appl. No. 14/228,360, filed Mar. 28, 2014, Lempel et al.
U.S. Appl. No. 14/228,982, filed Mar. 28, 2014, Ben-Moshe et al.
U.S. Appl. No. 14/229,491, filed Mar. 28, 2014, Luz et al.
U.S. Appl. No. 14/496,359, filed Sep. 25, 2014, Love et al.
U.S. Appl. No. 14/751,652, filed Jun. 26, 2015, Natanzon et al.
U.S. Appl. No. 14/979,890, filed Dec. 28, 2015, Meiri et al.
U.S. Appl. No. 15/085,168, filed Mar. 30, 2016, Meiri et al.
U.S. Appl. No. 15/081,137, filed Mar. 25, 2016, Natanzon et al.
U.S. Appl. No. 15/079,205, filed Mar. 24, 2016, Dorfman et al.
U.S. Appl. No. 15/079,213, filed Mar. 24, 2016, Ben-Moshe et al.
U.S. Appl. No. 15/079,215, filed Mar. 24, 2016, Krakov et al.
U.S. Office Action dated Aug. 27, 2015 corresponding to U.S. Appl. No. 14/228,971; 23 Pages.
Response to U.S. Office Action dated Aug. 27, 2015 corresponding to U.S. Appl. No. 14/228,971; Response filed on Jan. 14, 2016; 10 Pages.
U.S. Final Office Action dated Feb. 25, 2016 corresponding to U.S. Appl. No. 14/228,971; 27 Pages.
U.S. Office Action dated Sep. 22, 2015 corresponding to U.S. Appl. No. 14/228,982; 17 Pages.
Response to U.S. Office Action dated Sep. 22, 2015 corresponding to U.S. Appl. No. 14/228,982; Response filed on Feb. 1, 2016; 10 Pages.
Notice of Allowance dated Apr. 26, 2016 corresponding to U.S. Appl. No. 14/228,982; 9 Pages.
U.S. Office Action dated Jan. 12, 2016 corresponding to U.S. Appl. No. 14/229,491; 12 Pages.
U.S. Office Action dated Dec. 4, 2014 corresponding to U.S. Appl. No. 14/496,262; 16 Pages.
Response to U.S. Office Action dated Dec. 4, 2014 corresponding to U.S. Appl. No. 14/496,262; Response filed on Dec. 11, 2014; 12 Pages.
U.S. Notice of Allowance dated Jan. 9, 2015 corresponding to U.S. Appl. No. 14/496,262; 8 Pages.
312 Amendment filed Feb. 5, 2015 corresponding to U.S. Appl. No. 14/496,262; 9 Pages.
U.S. Notice of Allowance dated Mar. 16, 2015 corresponding to U.S. Appl. No. 14/620,631; 10 Pages.
EMC Corporation, "Introduction to the EMC XtremIO Storage Array;" Version 4.0; White Paper—A Detailed Review; Apr. 2015; 65 Pages.
Vijay Swami, "XtremIO Hardware/Software Overview & Architecture Deepdive;" EMC On-Line Blog; Nov. 13, 2013; Retrieved from <http://vjswami.com/2013/11/13/xtremio-hardwaresoftware-overview-architecture-deepdive/>; 18 Pages.
Response to U.S. Non-Final Office Action dated Feb. 9, 2017 for U.S. Appl. No. 14/228,971; Response filed on May 9, 2017; 12 Pages.
Request for Continued Examination (RCE) and Response to Final Office Action dated Feb. 25, 2016 corresponding to U.S. Appl. No. 14/228,971; Response filed on May 25, 2016; 12 Pages.
U.S. Office Action dated Jun. 10, 2016 corresponding to U.S. Appl. No. 14/228,971; 27 Pages.

(56) References Cited

OTHER PUBLICATIONS

Response to Office Action dated Jan. 12, 2016 corresponding to U.S. Appl. No. 14/229,491; Response filed on Jun. 2, 2016; 7 Pages.
Notice of Allowance dated Jul. 25, 2016 corresponding to U.S. Appl. No. 14/229,491; 10 Pages.
Office Action dated Jul. 15, 2016 corresponding to U.S. Appl. No. 14/751,652; 11 Pages.
U.S. Non-Final Office Action dated Apr. 21, 2017 for U.S. Appl. No. 15/079,215; 53 Pages.
U.S. Non-Final Office Action dated Dec. 1, 2017 for U.S. Appl. No. 14/979,890; 10 Pages.
Response to U.S. Non-Final Office Action dated Oct. 4, 2017 for U.S. Appl. No. 14/228,971; Response filed Jan. 26, 2018; 11 Pages.
Response to U.S. Non-Final Office Action dated Nov. 13, 2017 for U.S. Appl. No. 15/079,213; Response filed Feb. 13, 2018; 9 Pages.
Response to U.S. Non-Final Office Action dated Nov. 28, 2017 for U.S. Appl. No. 15/079,205; Response filed Feb. 28, 2018; 11 Pages.
Response to U.S. Non-Final Office Action dated Dec. 1, 2017 for U.S. Appl. No. 14/979,890; Response filed Feb. 28, 2018; 9 Pages.
U.S. Non-Final Office Action dated Oct. 4, 2017 for U.S. Appl. No. 14/228,971; 37 pages.
Notice of Allowance dated Sep. 22, 2017 for U.S. Appl. No. 15/079,215; 9 Pages.
Response (w/RCE) to U.S. Final Office Action dated Jun. 20, 2017 for U.S. Appl. No. 14/228,971; Response filed Sep. 13, 2017; 14 Pages.
U.S. Final Office Action dated May 29, 2018 for U.S. Appl. No. 14/228,971; 35 pages.
U.S. Non-Final Office Action dated May 31, 2018 for U.S. Appl. No. 15/281,593; 10 pages.
U.S. Final Office Action dated Jun. 20, 2017 for U.S. Appl. No. 14/228,971; 40 Pages.
U.S. Non-Final Office Action dated Nov. 13, 2017 for U.S. Appl. No. 15/079,213; 9 pages.
Response to U.S. Non-Final Office Action dated Dec. 22, 2017 for U.S. Appl. No. 15/282,546; Response filed May 17, 2018; 8 Pages.
U.S. Non-Final Office Action dated Feb. 9, 2017 for U.S. Appl. No. 14/228,971; 38 Pages.
U.S. Non-Final Office Action dated Nov. 28, 2017 corresponding to U.S. Appl. No. 15/079,205; 9 Pages.
U.S. Non-Final Office Action dated Dec. 22, 2017 corresponding to U.S. Appl. No. 15/282,546; 12 Pages.

* cited by examiner

DATA PROTECTION IN A HETEROGENEOUS RANDOM ACCESS STORAGE ARRAY

BACKGROUND

Storage systems may utilize an array of random access storage device such as solid-state drives (SSDs, also known as solid-state disks) to provide high performance scale-out storage.

RAID (Redundant Array of Inexpensive/Independent Disks) can provide increased resiliency and reliability to storage arrays. RAID allows reconstruction of failed disks (and parts of disks) through the use of redundancy. RAID 6 defines block-level striping with double distributed parity (N+2) and provides fault tolerance of two disk failures, so that a storage array can continue to operate with up to two failed disks, irrespective of which two disks fail. The double parity provided by RAID 6 also gives time to rebuild the array without the data being at risk if a single additional disk fails before the rebuild is complete. To provide efficient reads, data is stored "in the clear," whereas parity information can be based on a suitable coding scheme.

U.S. Pat. No. 8,799,705, issued on Aug. 5, 2014, which is hereby incorporated by reference in its entirety, describes a data protection scheme similar to RAID 6, but adapted to take advantage of random access storage.

Existing RAID techniques may be designed to work with an array of disks having equal storage capacity (or "size"). Over time, disk capacities may increase, making it desirable or even necessary to use larger disks when expanding a storage array. Replacing legacy disks with larger disks can be wasteful.

SUMMARY

Described herein are embodiments of a process for efficiently allocating RAID stripes across an array of disks (e.g., SSDs). In some embodiments, the process can be used to allocate RAID stripes across a "heterogeneous" storage array (i.e., an array of different sized disks). Also described herein are embodiments of a storage system that utilize said processing.

According to one aspect of the disclosure, a method comprises: aggregating chunks of data to fill a stripe with N data chunks; determining free capacity information for a plurality of disks within a storage array; selecting, from the plurality of disks, N+k disks based upon the free capacity information; generating k parity chunks using the N data chunks within the stripe; and writing each of the N data and k parity chunks to a respective one of the N+k disks.

In some embodiments, wherein selecting N+k disks based upon the free capacity information comprises selecting a set of N+k disks having a largest free capacity among the plurality of disks. In certain embodiments, wherein each of the plurality of disks is divided into a plurality of fixed-size chunks, wherein determining free capacity information for a plurality of disks comprises calculating a number of unoccupied chunks within each disk. In one embodiment, selecting a stripe to fill having a largest number of unoccupied data chunks. In certain embodiments, aggregating chunks of data comprises aggregating the chunks of data in a write cache. In some embodiments, the plurality of disks includes a plurality of solid state drives (SSDs). In various embodiments, at least two of the disks within the storage array have different capacities.

According to another aspect of the disclosure, a system comprises a processor and a memory storing computer program code that when executed on the processor causes the processor to execute embodiments of the method described hereinabove.

According to yet another aspect of the disclosure, a computer program product may be tangibly embodied in a non-transitory computer-readable medium, the computer-readable medium storing program instructions that are executable to perform embodiments of the method described hereinabove.

BRIEF DESCRIPTION OF THE DRAWINGS

The foregoing features may be more fully understood from the following description of the drawings in which.

The drawings are not necessarily to scale, or inclusive of all elements of a system, emphasis instead generally being placed upon illustrating the concepts, structures, and techniques sought to be protected herein.

DETAILED DESCRIPTION

Before describing embodiments of the structures and techniques sought to be protected herein, some terms are explained. As used herein, the term "storage system" may be broadly construed so as to encompass, for example, private or public cloud computing systems for storing data as well as systems for storing data comprising virtual infrastructure and those not comprising virtual infrastructure. As used herein, the terms "client" and "user" may refer to any person, system, or other entity that uses a storage system to read/write data.

As used herein, the term "storage device" may refer to any non-volatile memory (NVM) device, including hard disk drives (HDDs), flash devices (e.g., NAND flash devices), and next generation NVM devices, any of which can be accessed locally and/or remotely (e.g., via a storage attached network (SAN)). The term "storage array" may be used herein to refer to any collection of storage devices. In some embodiments, a storage array may provide data protection using RAID 4, RAID 5, RAID 6, or the like.

As used herein, the term "random access storage device" may refer to any non-volatile random access memory (i.e., non-volatile memory wherein data can be read or written in generally the same amount of time irrespective of the physical location of data inside the memory). Non-limiting examples of random access storage devices may include NAND-based flash memory, single level cell (SLC) flash, multilevel cell (MLC) flash, and next generation non-volatile memory (NVM). For simplicity of explanation, the term "disk" may be used synonymously with "storage device" herein.

While vendor-specific terminology may be used herein to facilitate understanding, it is understood that the concepts, techniques, and structures sought to be protected herein are not limited to use with any specific commercial products.

Figure 1:
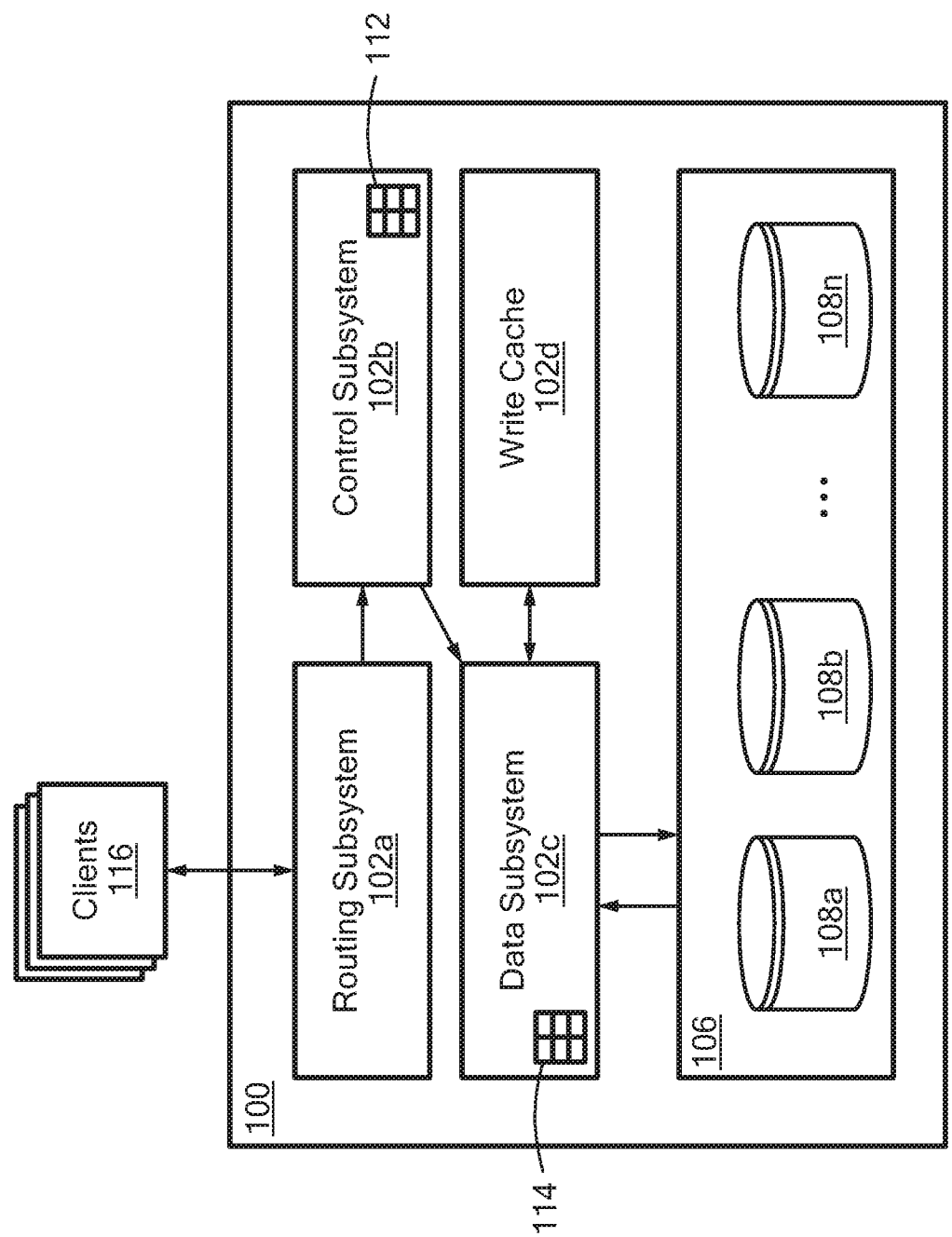
FIG. 1 is a block diagram of a storage system in accordance with an embodiment of the disclosure.

FIG. 1 shows a storage system 100 according to an illustrative embodiment of the disclosure. The storage system 100 may include a plurality of components 102a-102d (generally denoted 102 herein), and a storage array 106 comprising a plurality of disks 108a . . . 108n (generally denoted 108 herein). In some embodiments, the disks 108 correspond to SSDs. In various embodiments, the storage array 106 is heterogeneous, meaning that the disks 108 may have different storage capacities (or "sizes").

In the embodiment shown, the system components include a routing subsystem 102a, a control subsystem 102b, a data subsystem 102c, and a write cache 102d. In one embodiment, the components 102 may be provided as software components, i.e., computer program code that, when executed on a processor, may cause a computer to perform functionality described herein. In a certain embodiment, the storage system 100 includes an operating system (OS) and one or more of the components 102 may be provided as user space processes executable by the OS. In other embodiments, a component 102 may be provided, at least in part, as hardware such as digital signal processor (DSP) or an application specific integrated circuit (ASIC) configured to perform functionality described herein.

The routing subsystem 102a may be configured to receive read and write requests from clients 116 using, for example, an external application programming interface (API) and to translate client requests into internal commands. In some embodiments, the routing subsystem 102a is configured to receive Small Computer System Interface (SCSI) commands from clients. In certain embodiments, the system 100 may store data in fixed-size chunks, for example 4K chunks, where each chunk may have a unique hash value (referred to herein as a "chunk hash"). In such embodiments, the routing subsystem 102a may be configured to split data into fixed-size chunks and to calculate the corresponding chunk hashes. In one embodiment, chunk hashes are calculated using Secure Hash Algorithm 1 (SHA-1) processing. In some embodiments, a chunk corresponds to a fixed number of contiguous blocks within a storage device.

The control subsystem 102b may be configured to maintain a mapping between I/O addresses associated with data and the corresponding chunk hashes. As shown in FIG. 1, this mapping may be maintained using a data structure 112, referred to herein as an "I/O address to chunk hash mapping table" or "A2H table," according to some embodiments. In one embodiment, I/O addresses may be logical addresses used by clients to access data within the storage system 100.

The data subsystem 102c may be configured to maintain a mapping between chunk hashes and physical storage addresses (i.e., storage locations within the storage array 106 and/or within individual disks 108). As shown in FIG. 1, this mapping may be maintained as a data structure 114, referred to herein as a "hash to physical address mapping table" or "H2P table," according to some embodiments. The data subsystem 102c may also be configured to read and write data from/to the storage array 106 (and/or to individual disks 108 therein). In some embodiments, the data subsystem 102c may access the storage array 106 via a driver or other type of interconnect.

As shown, in some embodiments, the system may include a write cache 102d that may be configured to cache content data prior to writing to the storage array 106. Thus, the data subsystem 102c may be configured to send writes to the write cache 102d and, once enough writes have been collected, to commit the writes to disk 108. In one embodiment, the write cache 102d may form a portion of the data subsystem 102c.

It will be appreciated that combinations of the A2H 112 and H2P 114 tables can provide multiple levels of indirection between the logical (or "I/O") address a client 116 uses to access data and the physical address where that data is stored. Among other advantages, this may give the storage system 100 freedom to move data within the storage array 106 without affecting a client's 116 access to that data (e.g., if a disk 108 fails).

In various embodiments, the storage system 100 may provide data protection through redundancy such that if a disk 108 fails, the data stored therein may be recovered using information stored within other disks of the storage array 106 to a replacement disk. In certain embodiments, the storage system may be configured to provide double parity data protection. Thus, the storage system 100 may be able to tolerate the loss of at least two disks 108 concurrently. In one embodiment, data subsystem 102c may implement a data protection scheme similar to RAID 6, but adapted to take advantage of random access storage. In various embodiments, the storage system 100 can use data protection techniques described within U.S. Pat. No. 8,799,705, issued on Aug. 5, 2014, which is hereby incorporated by reference in its entirety.

Unlike some existing RAID systems, the storage system 100 may use fine granularity to obviate the need to keep dedicated spare disk space, according to some embodiments. In particular, the disks 108 can be logically divided into relatively small chunks (e.g., 4K chunks). A RAID stripe includes of N+k such chunks, N of which comprise data (e.g., user data or other content) and k of which comprise parity information calculated based on the N chunks. Because data is stored in relatively small chunks, a single write request received from a client 116 can result in many writes to the disk array 106. Moreover, updating any chunk within a stripe may require updating the k parity chunks.

According to some embodiments, the data subsystem 102c may aggregate chunk writes using the write cache 102d, which caches content data prior to writing to the disk array 106. In some embodiments, the data subsystem 102c may seek to aggregate enough chunks to fill a stripe so that an entire stripe can be written to disk(s) at the same time, thereby minimizing the number of parity updates. The data subsystem 102c can choose to write aggregated data to a new stripe or to an existing stripe with unused chunks (or "holes"). Such holes can result from client 116 updates when content-based addressing is used: if a client 116 updates the same I/O address with different content, a new chunk hash may be calculated that results in the data being written to a different physical storage location. In one embodiment, the data subsystem 102 may select an existing stripe with the largest number of unused (or "unoccupied") disk chunks. In some embodiments, the stripe size can be dynamic. For example, a maximum stripe size may be defined (e.g., 23+2) and, if no such stripes are available when writing (due to holes created by "old" blocks), a smaller stripe size can be used (e.g., 10+2).

In various embodiments, the data subsystem 102c may be configured to use a data protection scheme that does not require equal-sized disks 108, embodiments of which are described below in conjunction with FIGS. 2 and 3.

In some embodiments, the system 100 includes features used in EMC® XTREMIO®.

Figure 2:
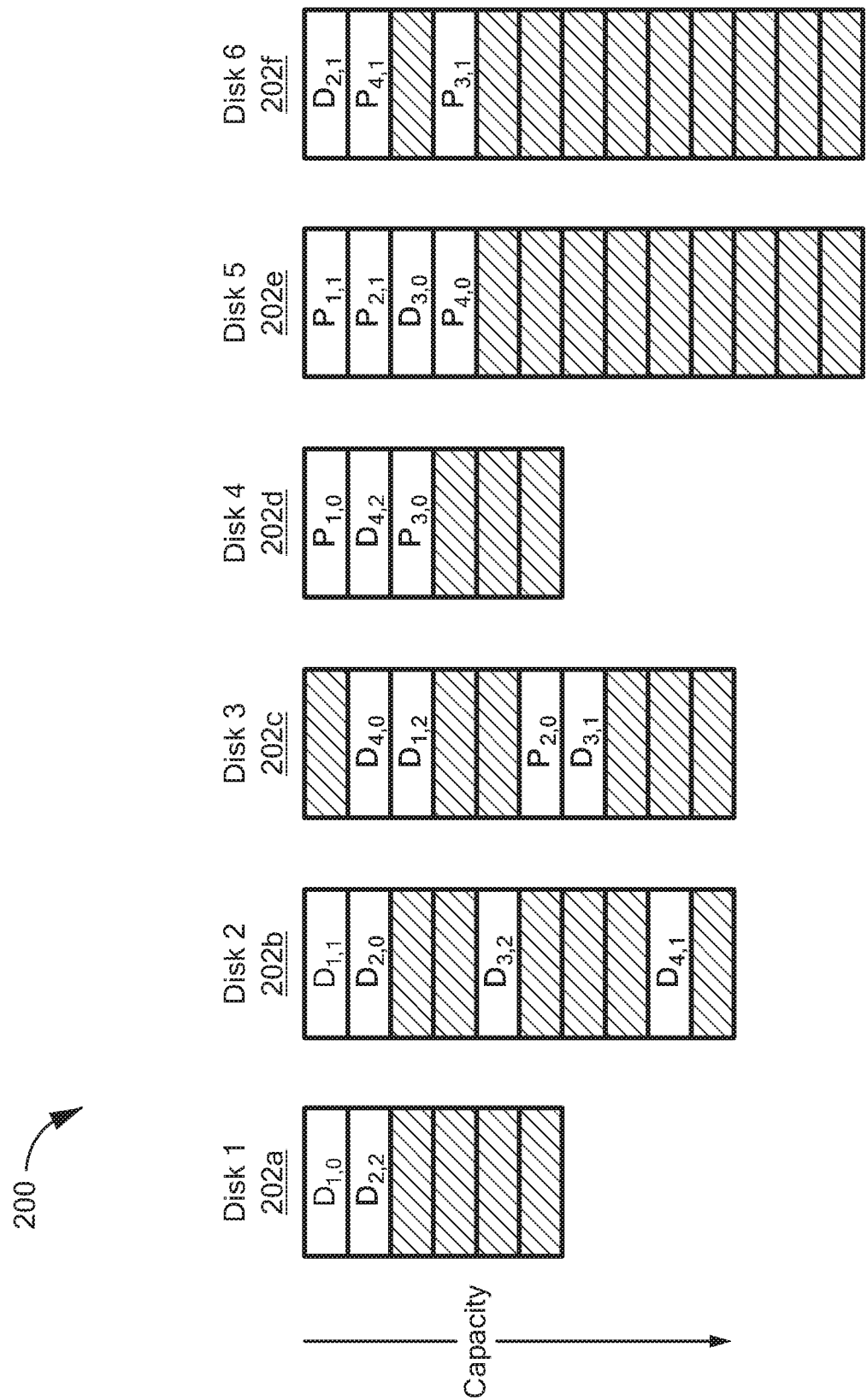
FIG. 2 is a diagram of a heterogeneous storage array in accordance with an embodiment of the disclosure.

FIG. 2 illustrates a process for data protection in a heterogeneous random access storage array, according to embodiments of the disclosure. A storage array 200 includes a plurality of disks (referred to generally herein as disks 202), with six (6) disks 202a-202f shown in this example. In one embodiment, a storage array 200 includes at least twenty five (25) disks 202.

Each disk 202 has a given capacity, which may be the same as or different from any other disk 202. A disk 202 may logically be divided up into relatively small fixed-size chunks (e.g., 4K chunks). In the simplified example of FIG. 2, disks 202a and 202d are assumed to have capacity to store six (6) chunks each, disks 202b and 202c are assumed to have capacity to store ten (10) chunks each, and disks 202e and 202f are assumed to have capacity to store thirteen (13) chunks each. In practice, each disk 202 may be capable of storing millions of chunks.

The process can provide N+k RAID protection, while utilizing the available capacity of disks 202. In an embodiment, most or all of the capacity can be utilized. A stripe may include N data chunks (denoted in FIG. 2 as $D_{S,0}$, $D_{S,1}, \ldots D_{S,N}$ for some stripe S) and k parity chunks (denoted in FIG. 2 as $P_{S,0}, P_{S,1}, \ldots P_{S,k}$ for some stripe S). In the embodiment shown, N=3 and k=2. Each disk 202 may be split up into relatively small chunks. Each chunk may be either occupied by a data chunk ("D"), a parity chunk ("P"), or is unoccupied (denoted using hatching in FIG. 2). For example, in the example shown, a first disk 202a may include two data chunks $D_{1,0}$ and $D_{2,2}$ and four unoccupied chunks.

For a given stripe, each of its N+k chunks should be stored on different disks 202 to provide the desired RAID protection. This is illustrated by FIG. 2, where three stripes (S=1, S=2, and S=3) each have five chunks stored across five different disks 202. For example, stripe S=1 has a first data chunk $D_{1,0}$ on disk 202a, a second data chunk $D_{1,1}$ on disk 202b, a third data chunk $D_{1,2}$ on disk 202d, a first parity chunk $P_{1,0}$ on disk 202d, and a second parity chunk $P_{1,1}$ on disk 202e.

For L disks, there are $$\binom{L}{N+k}$$

("L choose N+k") possible layouts for a stripe. The choice of which disks 202 are used to store individual stripes can affect allocation efficiency over the entire array 200. Choosing the optimal layout for a given stripe can be viewed as an optimization problem that may increase in complexity as the number of disks L increases and/or as the stripe size N+k approaches L/2.

To reduce complexity, a heuristic for chunk allocation may be used in some embodiments. Consider each disk 202 as a pool of X fixed-size chunks, where X may vary between disks 202. Per stripe, choose N+k disks 202 across which to store the stripe based upon the amount of free (or "unused") capacity within each disk 202. In some embodiments, free capacity is measured as the number of unoccupied chunks on a disk. In certain embodiments, free capacity is measured as a percentage (e.g., a percentage of chunks that are unoccupied). When writing a stripe, the set of N+k disks that have largest free capacity may be used.

In some embodiments, the data subsystem 102c keeps track of which stripes are allocated to which disks 202. In one embodiment, the data subsystem 102c tracks the number of unoccupied chunks per disk 202.

As an example, assume that the data subsystem 102c (FIG. 1) is ready to write a stripe to a storage array 200 in the state shown in FIG. 2. The data subsystem 102c may have collected enough writes in the write cache 102d to fill a stripe. The chunk allocation heuristic determines that disk 202a has four (4) unoccupied chunks, disk 202b has six (6) unoccupied chunks, disk 202c has six (6) unoccupied chunks, disk 202d has three (3) unoccupied chunks, disk 202e has nine (9) unoccupied chunks, and disk 202f has ten (10) unoccupied chunks. Thus, in some embodiments, for N=3 and k=2, the five (5) disks with the largest free capacity are 202f, 202e, 202c, 202b, and 202a (in order of available chunks from highest to lowest and assuming free capacity is measured by available chunks). The data subsystem 102c may write the N data chunks and k parity chunks to those disks, one chunk per disk.

Figure 3:
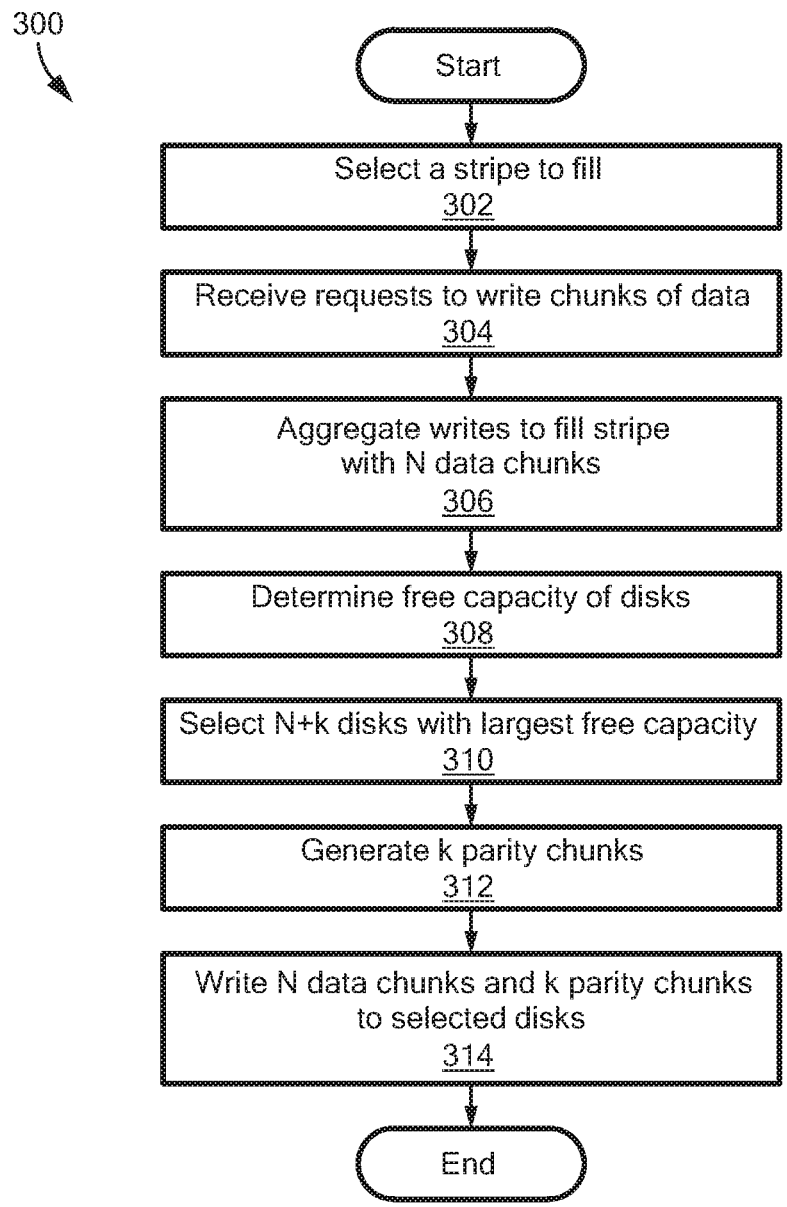
FIG. 3 is flow diagram illustrating processing that may occur within a storage system in accordance with some embodiments of the disclosure.

FIG. 3 is a flow diagram showing illustrative processing that can be implemented within a storage system, such as storage system 100 of FIG. 1. Rectangular elements (typified by element 302 in FIG. 3), herein denoted "processing blocks," represent computer software instructions or groups of instructions. Alternatively, the processing and decision blocks may represent steps performed by functionally equivalent circuits such as a digital signal processor (DSP) circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the concepts, structures, and techniques sought to be protected herein. Thus, unless otherwise stated the blocks described below are unordered meaning that, when possible, the functions represented by the blocks can be performed in any convenient or desirable order.

FIG. 3 illustrates a process 300 for allocating chunks to a stripe, according to embodiments of the disclosure. In the embodiment shown, the process 300 may seek to aggregate enough chunks to fill a stripe and then to write the entire stripe to disk(s) at the same time. Thus, at block 302, the process may begin by selecting a stripe to be filled. The selected stripe could be an existing stripe with unused chunks, or it could be a new stripe. In one embodiment, the process may select an existing stripe with the largest number of unused chunks.

At block 304, requests to write chunks of data may be received. In some embodiments, the requests may be received in response to user/client writes. At block 306, writes may be aggregated until there are enough writes to fill the stripe with N data chunks. In some embodiment, the process can aggregate N−M writes, where N is the number of data chunks that can be stored within the stripe and M is the number of those chunks that are currently occupied. In some embodiments, writes can be aggregated using a write cache 102d (FIG. 1).

At block 308, the free capacity of each disk within a storage array may be determined. In some embodiments, a disk's free capacity is measured as the number of unoccupied chunks on that disk.

At block 310, N+k disks may be selected using the disk free capacity information. In the embodiment shown, the set of N+k disks with the largest free capacity may be selected. At block 312, k parity chunks may be generated using the N data chunks within the stripe (i.e., the data chunks aggregated at block 306 in addition to any existing data chunks within the stripe). Any suitable technique can be used to generate the parity chunks. At block 314, the N data chunks and the k parity chunks may be written to the selected N+k disks. In some embodiments, one chunk may be written to each of the selected N+k disks.

Figure 4:
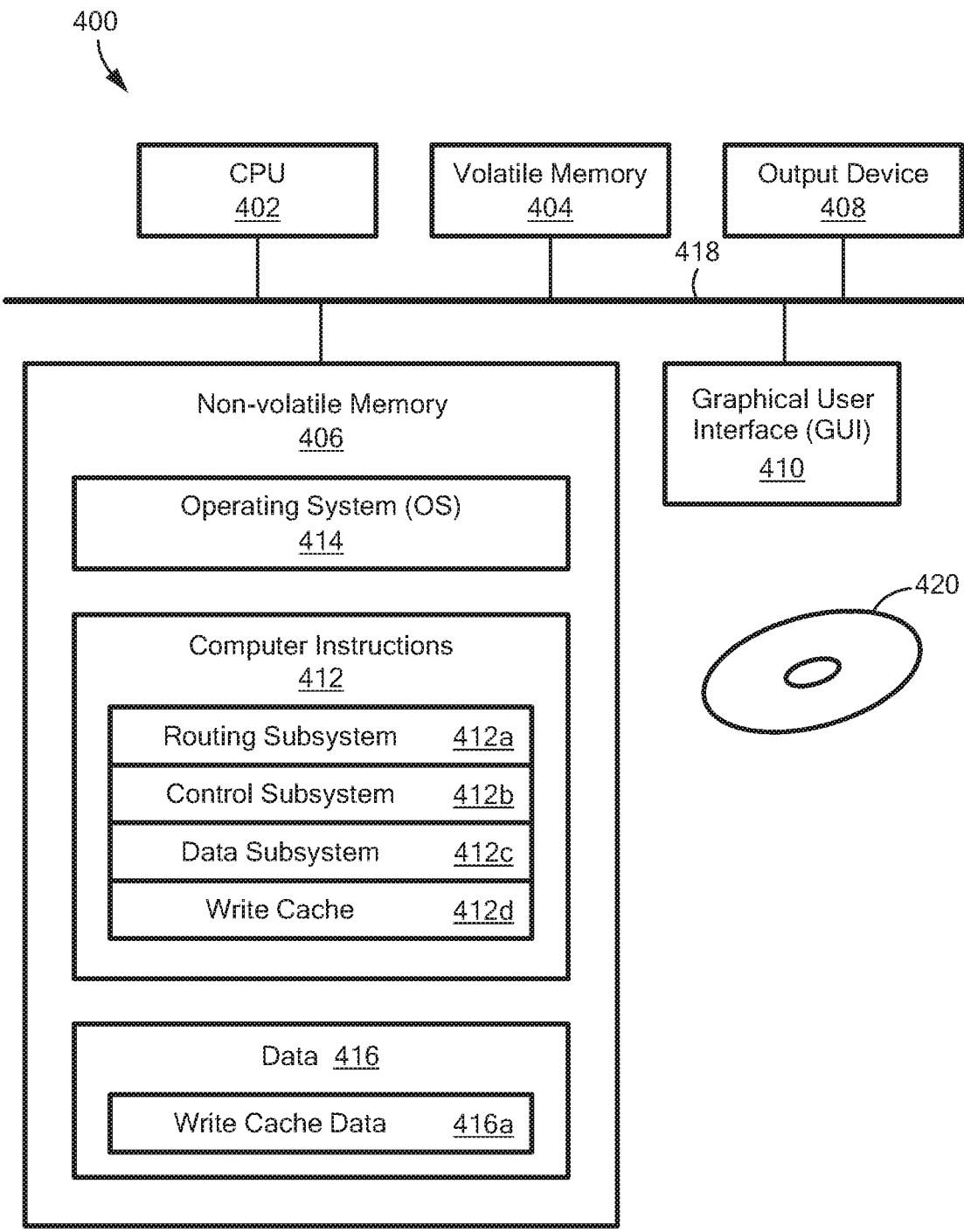
FIG. 4 is a schematic representation of an illustrative computer in accordance with an embodiment of the disclosure.

FIG. 4 shows an illustrative computer (e.g., physical or virtual) or other processing device 400 that can perform at least part of the processing described herein. In some embodiments, the computer 400 forms a part of a storage system, such as storage system 100 of FIG. 1. The computer 400 may include a processor 402, a volatile memory 404, a non-volatile memory 406 (e.g., hard disk or SSD), an output device 408 and a graphical user interface (GUI) 410 (e.g., a mouse, a keyboard, a display, for example), each of which is coupled together by a bus 418. The non-volatile memory 406 is configured to store computer instructions 412, an operating system 414, and data 416. In one embodiment, the computer instructions 412 are executed by the processor 402 out of volatile memory 404. In some embodiments, an article 420 comprises non-transitory computer-readable instructions.

In the embodiment shown, computer instructions 412 may include routing subsystem instructions 412a that may correspond to an implementation of a routing subsystem 102a (FIG. 1), control subsystem instructions 412b that may correspond to an implementation of a control subsystem 102b, data subsystem instructions 412c that may correspond to an implementation of a data subsystem 102c, and write cache instructions 412d that may correspond to an implementation of a write cache 102d. As shown, in some embodiments, non-volatile memory 406 may be configured to store data 416a used by a write cache 102d. In certain embodiments, write cache data 416a may be stored in volatile memory 404.

Processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A method for use in a storage system, comprising:

selecting a stripe having a largest number of unused chunks among a plurality of existing stripes, the selected stripe including M chunks of data that are currently used, the selected stripe having a total capacity of N chunks of data;

aggregating chunks of data that are associated with incoming write requests received at the storage system, the chunks of data being stored in a write cache until N–M chunks have been aggregated, the N–M chunks of data being used to fill a remaining capacity of the selected stripe for minimizing parity updates;

determining free capacity information for a plurality of disks within a storage array;

selecting, from the plurality of disks, N+k disks based upon the free capacity information, wherein the selected N+k disks are selected in order of highest available number of chunks using the free capacity information;

generating k parity chunks using the N data chunks within the selected stripe; and writing each of the N data and k parity chunks to a respective one of the N+k disks.

2. The method of claim 1 wherein selecting N+k disks based upon the free capacity information comprises selecting a set of N+k disks having a largest free capacity among the plurality of disks.

3. The method of claim 1 wherein each of the plurality of disks is divided into a plurality of fixed-size chunks, wherein determining free capacity information for a plurality of disks comprises calculating a number of unoccupied chunks within each disk.

4. The method of claim 1 wherein the plurality of disks includes a plurality of solid state drives (SSDs).

5. The method of claim 1 wherein at least two of the disks within the storage array have different capacities.

6. A system comprising:

a processor; and a memory storing computer program code that when executed on the processor causes the processor to execute a process operable to perform the operations of:

selecting a stripe having a largest number of unused chunks among a plurality of existing stripes, the selected stripe including M chunks of data that are currently used, the selected stripe having a total capacity of N chunks of data;

aggregating chunks of data that are associated with incoming write requests, the chunks of data being stored in a write cache until N–M chunks have been aggregated, the N–M chunks of data being used to fill a remaining capacity of the selected stripe for minimizing parity updates;

determining free capacity information for a plurality of disks within a storage array;

selecting, from the plurality of disks, N+k disks based upon the free capacity information, wherein the selected N+k disks are selected in order of highest available number of chunks using the free capacity information;

generating k parity chunks using the N data chunks within the selected stripe; and writing each of the N data and k parity chunks to a respective one of the N+k disks.

7. The system of claim 6 wherein the computer program code causes the processor to execute a process operable to select the N+k disks by selecting a set of N+k disks having a largest free capacity among the plurality of disks.

8. The system of claim 6 wherein each of the plurality of disks is divided into a plurality of fixed-size chunks, wherein the computer program code causes the processor to execute a process operable to determine the free capacity information for a plurality of disks by calculating a number of unoccupied chunks within each disk.

9. The system of claim 6 wherein the plurality of disks includes a plurality of solid state drives (SSDs).

10. The system of claim 6 wherein at least two of the disks within the storage array have different capacities.

11. A computer program product tangibly embodied in a non-transitory computer-readable medium, the computer-readable medium storing program instructions that are executable to:

selecting a stripe having a largest number of unused chunks among a plurality of existing stripes, the selected stripe including M chunks of data that are currently used, the selected stripe having a total capacity of N chunks of data;

aggregate chunks of data that are associated with incoming write requests, the chunks of data being stored in a write cache until N–M chunks have been aggregated, the N–M chunks of data being used to fill a remaining capacity of the selected stripe for minimizing parity updates;

determine free capacity information for a plurality of disks within a storage array;

select, from the plurality of disks, N+k disks based upon the free capacity information, wherein the selected N+k disks are selected in order of highest available number of chunks using the free capacity information;

generate k parity chunks using the N data chunks within the selected stripe; and write each of the N data and k parity chunks to a respective one of the N+k disks.

12. The computer program product of claim 11 wherein the computer-readable medium stores program instructions that are executable to select a set of N+k disks having a largest free capacity among the plurality of disks.

13. The computer program product of claim 11 wherein each of the plurality of disks is divided into a plurality of fixed-size chunks, wherein the computer-readable medium stores program instructions that are executable to determine free capacity information for a plurality of disks by calculating a number of unoccupied chunks within each disk.

14. The computer program product of claim 11 wherein the plurality of disks includes a plurality of solid state drives (SSDs).

\* \* \* \* \*